United States Patent
Sato

(10) Patent No.: US 10,495,271 B2
(45) Date of Patent: Dec. 3, 2019

(54) LIGHT EMITTING DEVICE AND METHOD FOR DETECTING ABNORMALITY IN LIGHT EMITTING DEVICE

(71) Applicant: NICHIA CORPORATION, Anan-shi, Tokushima (JP)

(72) Inventor: Daisuke Sato, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/201,707

(22) Filed: Nov. 27, 2018

(65) Prior Publication Data

US 2019/0195440 A1 Jun. 27, 2019

(30) Foreign Application Priority Data

Dec. 25, 2017 (JP) .................... 2017-248257

(51) Int. Cl.
*F21V 7/04* (2006.01)
*F21K 9/64* (2016.01)
(Continued)

(52) U.S. Cl.
CPC .............. *F21K 9/64* (2016.08); *H01S 5/0428* (2013.01); *H01S 5/0609* (2013.01); *H01S 5/0683* (2013.01); *F21Y 2115/30* (2016.08)

(58) Field of Classification Search
CPC ........ F21K 9/64; H01S 5/0428; H01S 5/0609; H01S 5/0683; H01S 5/06825;
(Continued)

(56) References Cited

U.S. PATENT DOCUMENTS

| | | | |
|---|---|---|---|
| 2005/0146725 A1* | 7/2005 | Hansen | G01N 21/55 356/446 |
| 2011/0157865 A1* | 6/2011 | Takahashi | F21V 29/58 362/84 |

(Continued)

FOREIGN PATENT DOCUMENTS

| | | |
|---|---|---|
| JP | 4902513 B2 | 3/2012 |
| JP | 5034719 B2 | 9/2012 |

(Continued)

*Primary Examiner* — Ali Alavi
(74) *Attorney, Agent, or Firm* — Global IP Counselors, LLP

(57) ABSTRACT

A method for detecting abnormality in a light emitting device including a semiconductor laser element that is pulse-driven by pulse-control to emit excitation light, a wavelength conversion member including a phosphor and that emits fluorescent light by being irradiated with the excitation light, and a light receiving element disposed on a light extraction side of the wavelength conversion member and that detects the excitation light, the method includes: pulse-controlling an applied voltage with a pulse width shorter than a time from a start of voltage application until an optical intensity of light extracted from the wavelength conversion member reaches a maximum intensity, thereby pulse-driving the semiconductor laser element to achieve laser oscillation; measuring an optical intensity of the excitation light, or optical intensities of both the excitation light and the fluorescent light; and determining whether or not the optical intensity or the optical intensities falls within a prescribed range.

12 Claims, 8 Drawing Sheets

(51) Int. Cl.
*H01S 5/0683* (2006.01)
*H01S 5/06* (2006.01)
*H01S 5/042* (2006.01)
*F21Y 115/30* (2016.01)

(58) Field of Classification Search
CPC ............. H01S 5/02296; H01S 5/32341; H01S 5/06835; H01S 5/06216; H01S 5/02469; H01S 5/02212; F21V 2115/30
USPC ........................................................ 362/618
See application file for complete search history.

(56) References Cited

U.S. PATENT DOCUMENTS

| | | | | |
|---|---|---|---|---|
| 2012/0212143 A1* | 8/2012 | Esaki | .................. | H05B 33/089 |
| | | | | 315/192 |
| 2013/0176031 A1* | 7/2013 | Huang | .................. | B60Q 11/005 |
| | | | | 324/414 |
| 2013/0314711 A1* | 11/2013 | Cantin | .................... | G01S 17/10 |
| | | | | 356/445 |
| 2014/0168940 A1* | 6/2014 | Shiomi | ................. | B60Q 1/0023 |
| | | | | 362/84 |
| 2014/0204398 A1 | 7/2014 | Sato et al. | | |
| 2014/0286365 A1 | 9/2014 | Ishikawa | | |
| 2014/0334167 A1 | 11/2014 | Tiefenbacher | | |
| 2015/0109759 A1* | 4/2015 | Sugano | ................. | A61B 1/0669 |
| | | | | 362/84 |
| 2017/0307164 A1 | 10/2017 | Atoji | | |
| 2018/0227057 A1* | 8/2018 | Kase | ...................... | H04B 10/40 |

FOREIGN PATENT DOCUMENTS

| | | |
|---|---|---|
| JP | 2012-220811 A | 11/2012 |
| JP | 5204885 B2 | 6/2013 |
| JP | 2013-168586 A | 8/2013 |
| JP | 2014-165450 A | 9/2014 |
| JP | 2014-187326 A | 10/2014 |
| JP | 2015-506301 A | 3/2015 |
| JP | 5866521 B1 | 2/2016 |

* cited by examiner

LIGHT EMITTING DEVICE AND METHOD FOR DETECTING ABNORMALITY IN LIGHT EMITTING DEVICE

CROSS-REFERENCE TO RELATED APPLICATION

This application claims priority to Japanese Patent Application No. 2017-248257, filed on Dec. 25, 2017, the disclosure of which is hereby incorporated by reference in its entirety.

BACKGROUND

1. Technical Field

The present disclosure relates to a light emitting device and a method for detecting abnormality in light emitting device.

2. Description of Related Art

Lighting, automotive headlights, and the like have become popular applications of semiconductor laser elements in recent years. However, the higher is the output power of a laser beam, the greater is the risk it poses to human eyes, so special safety measures are now required in applications in which a laser beam comes into contract with the human eye.
For example, in the case that the light source is a combination of a blue laser diode and a wavelength conversion member, the blue laser light is emitted directly to the outside in the event that the wavelength conversion member is defective or comes loose. For this reason, safety measures have been proposed such as stopping the emission of the laser diode when it is detected that the wavelength conversion member is defective and/or has come loose. See, for example, Japanese Unexamined Patent Application Publication No. 2013-168586, Japanese Unexamined Patent Application Publication No. 2015-506301, and Japanese Unexamined Patent Application Publication No. 2014-165450.

SUMMARY

A light emitting device with which higher output and reliability can both be obtained needs more reliable safety measures against abnormalities in a light emitting device with a defective wavelength conversion member. To that end, it is important to further improve the accuracy at which such abnormalities can be detected.

In view of this, it is an object of an embodiment of the present invention to provide a method for detecting abnormality in a light emitting device capable of more accurately detecting defects in a wavelength conversion member, as well as a light emitting device having a configuration that allows this detection method to be realized.

A method according to an embodiment is a method for detecting abnormality in a light emitting device including a semiconductor laser element configured and arranged to be pulse-driven by pulse-control to emit excitation light, and a wavelength conversion member including a phosphor and configured and arranged to emit fluorescent light by being irradiated with the excitation light, the method includes: pulse-controlling an applied voltage applied to the semiconductor laser element with a pulse width shorter than a time from a start of voltage application until an optical intensity of light extracted from the wavelength conversion member reaches a maximum intensity, thereby pulse-driving the semiconductor laser element to achieve laser oscillation; measuring an optical intensity of the excitation light, or optical intensities of both the excitation light and the fluorescent light; and determining whether or not the optical intensity or the optical intensities falls within a prescribed range.

A light emitting device according to an embodiment includes a semiconductor laser element, a wavelength conversion member, and a light receiving element. The semiconductor laser element is configured and arranged to be pulse-driven by pulse-control to emit excitation light. The wavelength conversion member includes a phosphor and configured and arranged to emit fluorescent light by being irradiated with the excitation light. The light receiving element is disposed on a light extraction side of the wavelength conversion member, and configured and arranged to detect light having a wavelength corresponding to the excitation light. The light receiving element is disposed movably from a light irradiation region to a region outside the light irradiation region.

The embodiment of the present invention provides a method for detecting an abnormality in a light emitting device, with which a defective wavelength conversion member can be detected by a simpler and more reliable method, and safety measures can be taken against this.

The embodiment of the present invention also provides a light emitting device having a configuration with which such an abnormality detection method can be realized.

The phrase "a defect in the wavelength conversion member" or "a defective wavelength conversion member" refers to a state in which a crack has developed in pan of the phosphor, part of the phosphor has chipped off, or all of the wavelength conversion member has fallen off.

DETAILED DESCRIPTION

Figure 1A:
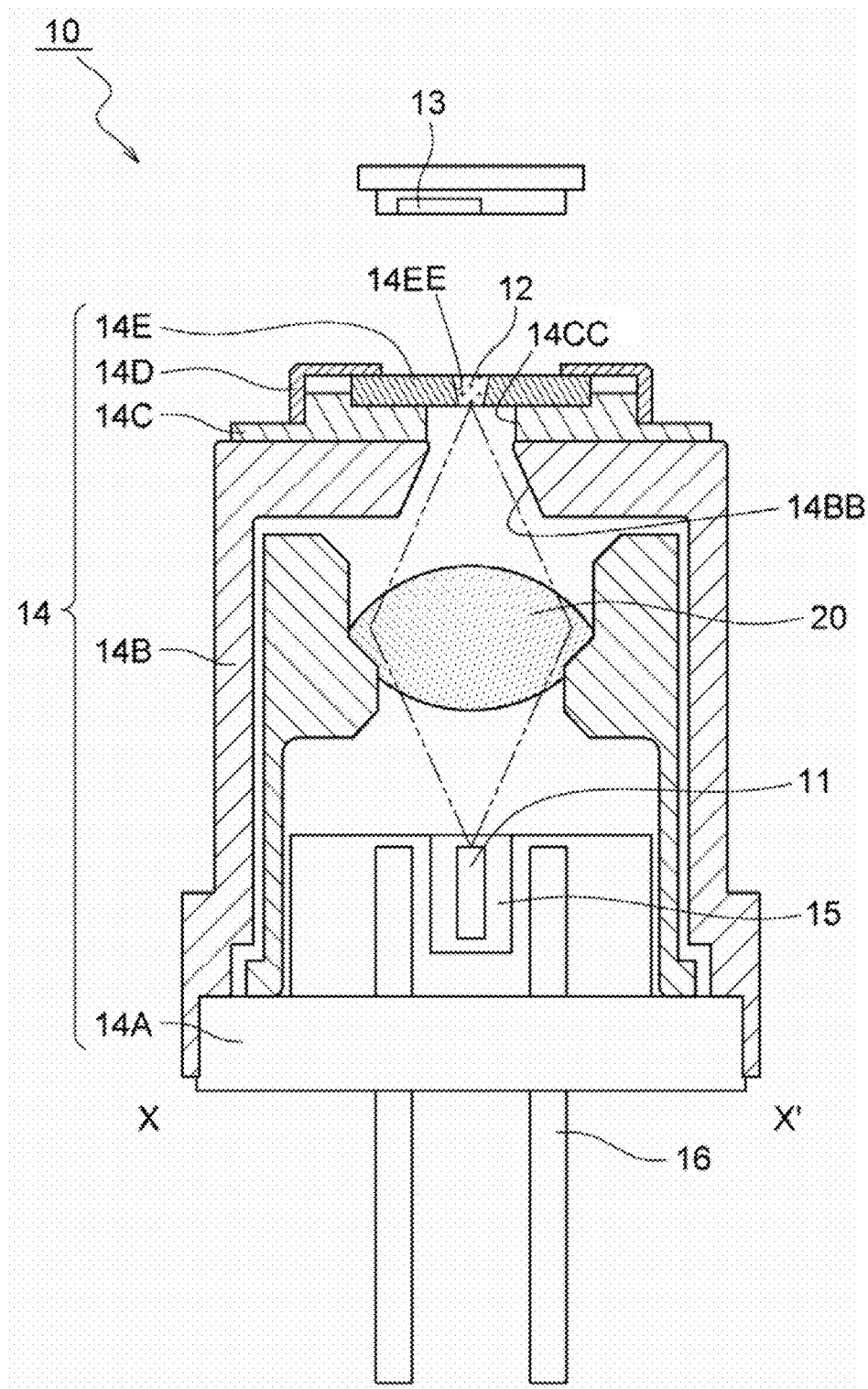
FIG. 1A is a schematic cross-sectional view illustrative of one embodiment of the light emitting device of the present invention.

The drawings referred to in the description below schematically show certain embodiments. In the drawings, the scale, interval, positional relationship and the like of members may be exaggerated, or illustration of members may be partially omitted. Further, scale or interval of members may not coincide between a plan view and its corresponding cross-sectional view. Further, in the following description below the same name and reference numeral denote the same or similar members, and the detailed description thereof will be omitted as appropriate.

Light Emitting Device

Figure 1B:
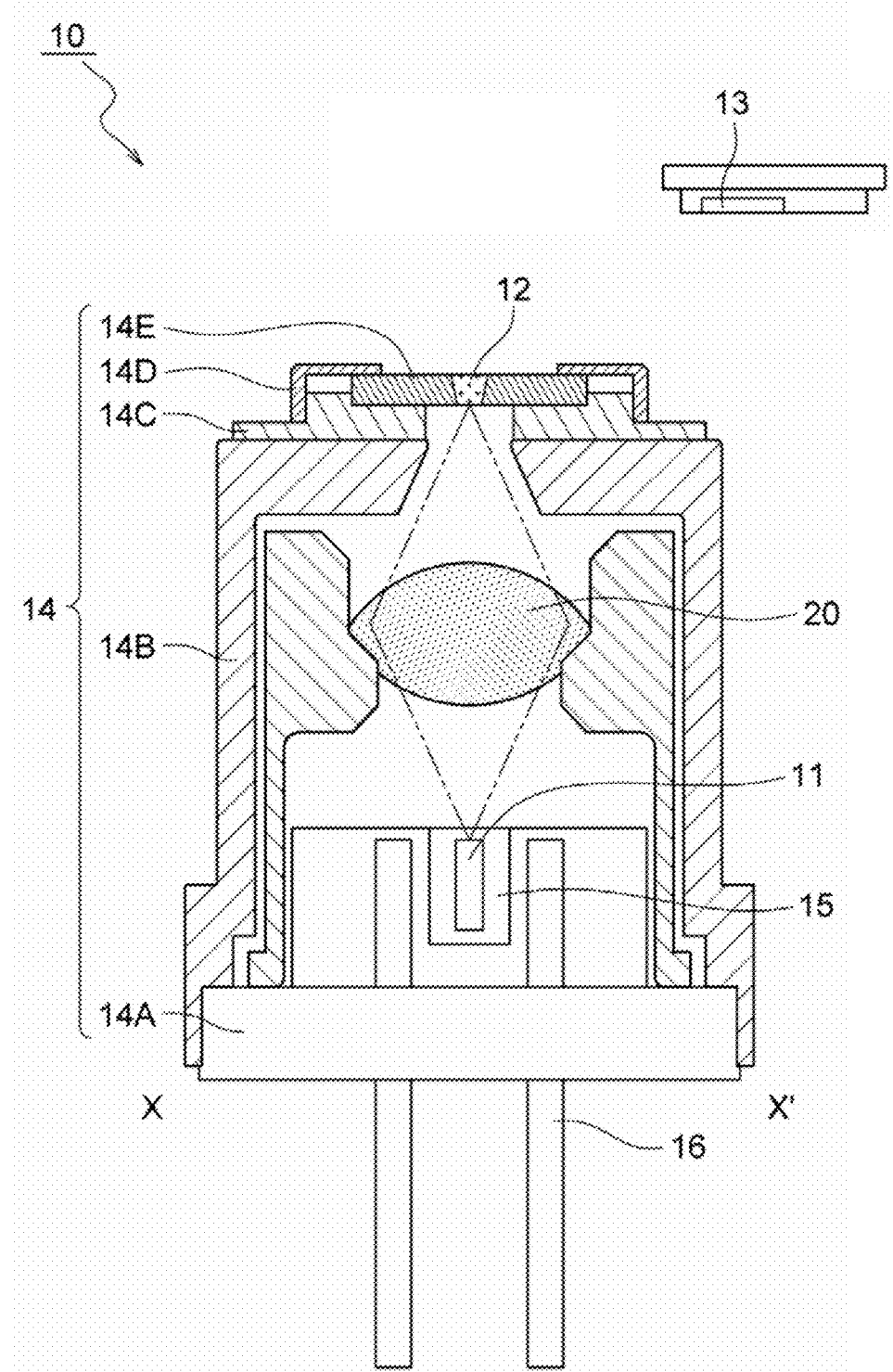
FIG. 1B is a schematic cross-sectional view illustrative of one embodiment of the light emitting device of the present invention.

As shown in FIGS. 1A and 1B, a light emitting device 10 in an embodiment of the present invention includes a semiconductor laser element 11, a wavelength conversion member 12, and a light receiving element 13. Such a light emitting device 10 usually includes a package that houses the semiconductor laser element 11 and supports the wavelength conversion member 12.

With this configuration, an abnormality of the light emitting device 10, that is, that the laser beam is being emitted directly to the outside due to a defect in the wavelength conversion member 12, can be detected more reliably and easily. This makes it possible for safety measures such as stopping the drive of the semiconductor laser element 11 to be implemented more surely.

Semiconductor Laser Element 11

The semiconductor laser element 11 is a light emitting element that functions as an excitation light source that emits excitation light. The semiconductor laser element 11 can be controlled to either pulse drive or continuous drive. Since the light emitting device 10 in this embodiment can more accurately detect defects in the wavelength conversion member 12 (as discussed below), the light source thereof can be the semiconductor laser element 11, which has high emission output and high directivity. The output of the semiconductor laser element 11 is, for example, an output of ranging from 1 W to several hundred watts.

The peak wavelength of the semiconductor laser element 11 that can be combined with the wavelength conversion member 12 is 300 to 500 nm, for example. When the wavelength conversion member 12 contains a yellow fluorescent material such as a YAG fluorescent material, the semiconductor laser device 11 preferably has an emission peak wavelength in the range of 400 nm to 470 nm, more preferably has a light emission peak wavelength in the range of 420 nm to 470 nm.

In the light emitting device 50, the semiconductor laser element 11 can be fixed to a submount 15 provided inside a package 14 (discussed below) using a the bonding member. This die bonding member is preferably a material with excellent heat dissipation properties, specific examples of which include Au—Sn eutectic alloys and indium alloys.

Package 14

The package 14 of the light emitting device 10 houses the semiconductor laser element 11 and supports the wavelength conversion member 12. This is not the only option, and a member that supports the wavelength conversion member 12 may be provided away from the package housing the semiconductor laser element 11.

As shown in FIGS. 1A and 1B, the light emitting device 10 preferably has a package 14 that houses the semiconductor laser element 11 and in which a plurality of members that support the wavelength conversion member 12 are integrated at sites opposite the semiconductor laser element 11. This allows the light emitting device 10 to be smaller in size as compared to when the supporting member of the wavelength conversion member 12 is provided separately from the package.

As shown in FIG. 1A, the package 14 is made up of a base portion 14A, a cap 14B, a lower support member 14C, an upper support member 14D, a holder 14E, and the like, for example.

With the light emitting device 10, the submount 15 is installed on the side face of a columnar member rising up from the upper face of the base portion 14A. The semiconductor laser element 11 is fixed to the surface of the submount 15. Thus fixing the semiconductor laser element 11 to the side face of the submount 15 that is fixed to the upper face side of the base portion 14A facilitates a reduction in size of the device.

A hollow cap 14B is joined by welding or the like to the upper face side of the base portion 14A, in the vicinity of the edge of the base portion 14A, so as to cover the semiconductor laser element 11. A through-hole 14BB for extracting light is disposed in the upper face of the cap 14B, passing through in the thickness direction and at a position opposite the semiconductor laser element 11, and a lower support member 14C in which is formed a through-hole 14CC that passes through in the thickness direction is disposed at a position corresponding to the through-hole 14BB. Further, the wavelength conversion member 12 and the holder 14E are disposed so as to block off the through-hole 14CC of the lower support member 14C. A through-hole 14EE is provided in the holder 14E, and the wavelength conversion member 12 is fixed inside this through-hole 14EE. The holder 14E is fixed by being sandwiched between the lower support member 14C and the upper support member 14D. The inner wall of the through-hole 14EE provided in the holder 14E is inclined so that the hole diameter increases from the semiconductor laser element 11 side to the upper face side. Consequently, some of the light moving toward the semiconductor laser element 11 in the through-hole 14EE can be reflected by the inner wall and directed to the upper face side, so the light extraction efficiency of the wavelength conversion member 12 can be increased.

A plurality of lead terminals 16 are fixed via insulating members into through-holes that go from the upper face side of the base portion 14A to the bottom face side. Inner lead portions of the lead terminal 16 extending to the upper face side of the base portion 14A are electrically connected to the semiconductor laser element 11 via wires or the like. Outer lead portions extending to the bottom face side of the lead terminals 16 are mounted on a circuit board or the like and are electrically connected to an external power supply.

With this light emitting device 10, heat from the wavelength conversion member 12 is transmitted to the base portion 14A via the holder 14E, the upper supporting member 14D, the lower supporting member 14C, and the cap 14B. Heat from the semiconductor laser element 11 is also transmitted to the base portion 14A, via the submount 15. Therefore, the package 14 is preferably used as a heat dissipating member and made of a material having good thermal conductivity. Here, "good thermal conductivity" means that the thermal conductivity at 20° C. is several W/m·k or more, with 10 W/m·k or more being better, 25 W/m·k or more being more preferable, and 50 W/m·k or more being even better. In this case, the cap 14B, the lower support member 14C, the upper support member 14D, and the holder 14E are preferably made of a material having a higher thermal conductivity than the wavelength conversion member 12. This allows heat from the wavelength conversion member 12 to be efficiently dissipated. The package 14 is preferably made of a material having good heat resistance. Here, "good heat resistance" means that the melting point is several hundred degrees Celsius or more, more preferably 1000° C. or more, and still more preferably 1500° C. or more.

The base portion 14A can be formed from various materials that are electrically conductive and thermally insulating. For example, a metal such as Cu, W, Ta, Mo, Al, Fe, Ag, Au, Rh, KOVAR®, brass, CuW, CuMo or the like can be used. These metals may be used as a base material, and all or part of the surface thereof may be plated with Au, Ag, Al, Ni or the like. It is particularly preferable for the surface to be formed from Cu or a Cu alloy that has been plated with Au.

The cap 14B, the lower support member 14C, and the upper support member 14D can be made of stainless steel, KOVAR®, CuW, Ni, Co, Fe, brass or the like. Stainless steel, KOVAR®, and other such materials with high thermal conductivity are particularly preferable. The surface of these members may be plated with Ni or the like.

Examples of the material of the holder 14E include ceramics such as silicon carbide, aluminum oxide, silicon nitride, aluminum nitride, titanium oxide, and tantalum oxide, as well as W, Ta, Mo, KOVAR® and other such metals with a high melting point. It is preferable for the holder 14E to be formed from a ceramic containing aluminum oxide and having relatively high thermal conductivity and reflectivity.

The shape, size, and so forth of the package 14 can be appropriately set as dictated by the purpose of use and the intended action and/or effect.

In order to insulate it from the base portion 14A, the submount 15 on which the semiconductor laser element is mounted is preferably made from a material having high thermal conductivity and electrical insulation, such as silicon carbide, aluminum oxide, or aluminum nitride.

Wavelength Conversion Member 12

The wavelength conversion member 12 is disposed in front of the emitting end of the excitation laser light of the semiconductor laser element 11 so that substantially all of the laser light emitted from the semiconductor laser element 11 can be incident. When a reflecting member that reflects laser light is disposed along the path of the laser beam, the wavelength conversion member 12 may be disposed somewhere other than in front of the light emitting end face of the semiconductor laser element 11. The wavelength conversion member 12 includes a phosphor capable of emitting light (fluorescent light) of another wavelength by using light from the semiconductor laser element 11 as excitation light. The light emitting device 10 in this embodiment is provided with the wavelength conversion member 12 so as to block off the through-hole of the holder 14E of the package 14. This allows a mixed color light, such as white light, that is a mixture of the light from the semiconductor laser element 11 and the light that has undergone wavelength conversion by the wavelength conversion member 12 to be extracted to the outside as the optical emission of the light emitting device 10. The type of semiconductor laser element and the type of phosphor can be chosen to appropriately adjust the color of light to be extracted.

The wavelength conversion member 12 can have a light incident face on which light from the semiconductor laser element 11 is incident, and a light extraction face that is a different from the light incident face. When a transmissive wavelength conversion member 12 such as this is used, there is a higher probability that laser light will be extracted directly to the outside in the case that the wavelength conversion member is defective, than when using a reflective wavelength conversion member in which the light incident face is the same as the light extraction face. Therefore, defects in the wavelength conversion member 12 need to be detected more accurately.

The phosphor can be any known type, such as cerium-activated yttrium aluminum garnet (YAG), cerium activated lutetium aluminum garnet (LAG), europium and/or chromium activated nitrogen containing aluminosilicate calcium ($CaO$—$Al_2O_3$—$SiO_2$), europium-activated silicate (($Sr$, $Ba)_2$ $SiO_4$), β sialon phosphor, KSF based phosphor ($K_2SiF_6$:Mn) or the like, taking into account the wavelength of the excitation light to be used, the color of light to be obtained, and so on. It is particularly favorable to use a YAG phosphor that is heat resistant. The phosphor may be a single type, or two or more types can be used in combination.

Using these phosphors results in a light emitting device that emits mixed color light (such as white light) that is a mixture of fluorescent light and excitation light of visible wavelength, a light emitting device that emits fluorescent light of visible wavelength excited by excitation light of ultraviolet light, or the like. Examples of phosphors that emit white light in combination with a blue light emitting element include a phosphor that is excited by blue and exhibits broad yellow emission.

The wavelength conversion member 12 can be made of glass, ceramic, or another such material containing a phosphor. More specifically, examples of ceramics include aluminum oxide, silicon dioxide, zirconium oxide, barium oxide, titanium oxide, yttrium oxide, silicon nitride, aluminum nitride or the like. These may be used alone or in combinations of two or more types. From the standpoints of good transparency, and melting point, thermal conductivity, etc., a material containing aluminum oxide is preferable. The wavelength conversion member may be either a single-layer structure or a laminated structure.

In the case that the wavelength conversion member 12 is made of such a material, then even when the phosphor is heated to a high temperature by irradiation with laser light, the wavelength conversion member 12 itself will be less likely to melt, and deformation and discoloration of the conversion member 12 can be avoided. Thus, the optical characteristics can be kept from deteriorating over an extended period of time. Also, using a material with excellent thermal conductivity allows the heat generated by the phosphor to be efficiently released, so a rise in the temperature of the phosphor will be unlikely to lower the light conversion efficiency.

The wavelength conversion member 12 may contain a light scattering material as needed.

Light Receiving Element 13

The light receiving element 13 is disposed on a light extraction side of the wavelength conversion member 12, is disposed at a site where the excitation light emitted from the semiconductor laser element 11 can be incident, and is capable of detecting excitation light. For example, as discussed above, with a light emitting device 10 for obtaining white light, the light receiving element 13 can be one that can detect blue light. In the case that the light emitting device has a package which houses the semiconductor laser element and supports the wavelength conversion member, the light receiving element may be disposed in the package or outside of the package.

The light receiving element can be a silicon photodiode, which is a semiconductor light receiving element, and can also be a photoelectric tube, a photomultiplier tube, or the like.

The light receiving element 13 may be designed to be sensitive to just a specific wavelength range by using a specific band pass filter in combination, etc., but in this embodiment, as will be described below, the light receiving element 13 is irradiated with light that is predominantly excitation light, which is before the phosphor completely emits light. Therefore, even though the light receiving element 13 is one having light receiving sensitivity in a wavelength band other than that of the excitation light, detection accuracy is unlikely to decrease. Therefore, the light receiving element 13 may be, for example, one with a wide receivable wavelength range, such as one capable of receiving all types of visible light.

The light receiving element 13 is one that can detect the excitation light emitted from the semiconductor laser element 11 being used, by photoelectric conversion. In this Specification, "can detect light of a specific color by photoelectric conversion" means having sensitivity to at least part of the wavelength spectrum of that light, typically, to at least the peak wavelength. For example, in the case of a photodiode, the light receiving sensitivity (A/W) with respect to the peak wavelength of the light is preferably 0.1 or more, more preferably 0.2 or more.

As shown in FIG. 1A, it is preferable for the light receiving element 13 to be positioned so that it can move from the light irradiation region of the light emitting device 10 to a region outside light irradiation region as shown in FIG. 1B. That is, it is preferable for the light receiving element 13 to be installed along with a movement means or movement mechanism so that it can be moved outside the irradiation region after the optical intensity of the excitation light or the like has been measured, by pulse drive of the semiconductor laser element 11. An example of this movement means is a stepping motor. In addition to this, any means known in this field can be used for the movement means. In this Specification, "the optical intensity of the excitation light or the like" refers either to the optical intensity of the excitation light, or to the optical intensities of both the excitation light and the fluorescent light.

As described above, with the light emitting device 10 in this embodiment, because the light receiving element 13 capable of detecting excitation light is provided on the light extraction side of the wavelength conversion member 12, abnormalities such as a defect in the wavelength conversion member 12 can be detected very accurately. As a result, the emission of the light emitting device 10 can be stopped by stopping the drive of the semiconductor laser element 11, for example, so a light emitting device 10 that is very safe can be obtained.

Control Section

The light emitting device 10 can have a control section capable of stopping the application of voltage to the semiconductor laser element 11 on the basis of the value sensed by the light receiving element 13, which senses the optical intensity of the excitation light or the like. Consequently, in the case that an abnormality is detected in the light emitting device 10, the operation of the semiconductor laser element 11 can be stopped, such as not permitting the start of normal drive of the semiconductor laser element 11, so it is possible to avoid external emission of the laser beam.

Figure 3:
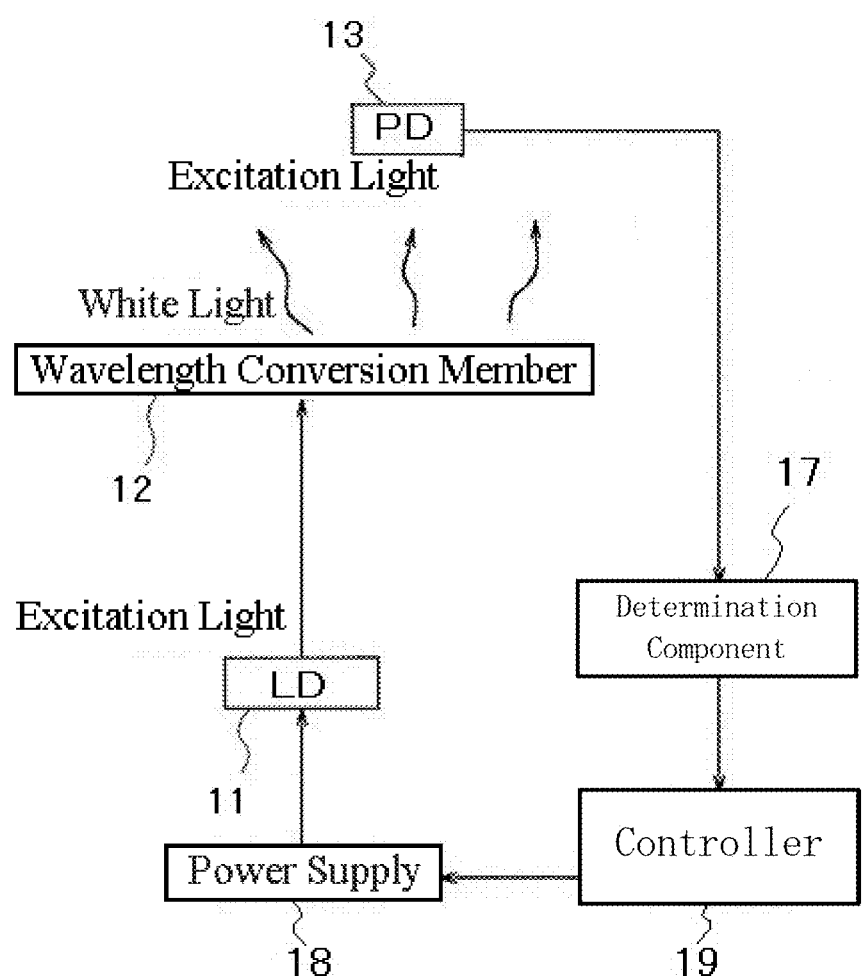
FIG. 3 is a block diagram of one embodiment of the light emitting device of the present invention.

As shown in FIG. 3, the control section includes, in the light emitting device shown in FIG. 1A, a determination component 17 that determines whether or not the optical intensity of the excitation light or the like sensed by the light receiving element 13 falls within a prescribed range, and a controller 19 that controls a power supply 18 for driving the semiconductor laser element on the basis of the determination output from the determination component 17. The controller 19 is an electric controller that preferably is a microcomputer that includes one or more processors and one or more computer storage devices (i.e., computer memory devices). The controller 19 is formed of one or more semiconductor chips that are mounted on a printed circuit board. The term "electronic controller" as used herein refers to hardware that executes software programs. The determination component 17 is a circuit that receives the light detection signal from the tight receiving element 13 and that outputs a light detection determination result to the controller 19. The determination component 17 is formed of one or more semiconductor chips that are mounted on a printed circuit board. A circuit serving as both of the controller 19 and the determination component 17 may be used.

Consequently, in the case that the optical intensity of the excitation light or the like sensed by the light receiving element 13 is outside a prescribed range, it is determined that the wavelength conversion member is defective for some reason, and the drive of the semiconductor laser element 11 is stopped. The prescribed range is set as follows, for example. The maximum value of the optical intensity of the excitation light or the like is measured for a plurality of normal products, the average value and the standard deviation ($\sigma$) thereof are calculated, and the sum of adding an arbitrary multiple of the standard deviation (such as $5\sigma$) to the average value can be set as the upper limit value. For instance, the prescribed range can be a range of less than 1.3 times the maximum value of the optical intensity of the excitation light or the like in a normal product.

Instead of outputting a stop signal to the power supply, the control section may have a self-holding type of relay switch interposed In the power supply path so that the power supply itself is interrupted.

Other Members

In the light emitting device of this embodiment, members such as a light reflecting member, a lens (a condensing lens

20, a collimating lens, etc.), and a fiber, for example, may be used singly or in combination. Also, the light that has passed through the wavelength conversion member 12 may be condensed with a lens or the like. Using such a member allows the size and shape of the spot of light emitted from the light emitting device 10 to be adjusted.

Method for Detecting Abnormality in Light Emitting Device

In the method tor detecting abnormality in a light emitting device of this embodiment, the light emitting device 10 as described above is used.

First, the semiconductor laser element 11 in the light emitting device 10 is pulse driven at a prescribed pulse width to achieve laser oscillation. The oscillated laser light then reaches the wavelength conversion member 12 as excitation light and part of it exits from the wavelength conversion member 12, so the optical intensity of the excitation light or the like is measured. After this, it is determined whether or not the measured optical intensity of the excitation light falls within a prescribed range.

Thus, it is possible to detect an abnormality such that excitation light stronger than normal is extracted to the outside due to abnormality of the light emitting device 10, or more specifically, to a defect in the wavelength conversion member. Performing pulse drive makes it possible to measure the intensity of only the excitation light component, in which substantially no fluorescent light is mixed, so it is possible to determine that there is an abnormality even with a slight defect of the wavelength conversion member 12.

This method for detecting abnormality in the light emitting device 10 may be performed before the normal lighting of the light source, or while the light source is lit. As described below, in the case that the light-off duration in abnormality detection is kept sufficiently short, such as on the order of nanoseconds (ns), it will generally not be recognized as a flicker or the like by the human eye, and since no difference from normal lighting is perceived, the detection can be performed during normal lighting. However, as will be discussed below, depending on the layout of the light receiving element 13, it may be preferable to perform the detection before the normal lighting of the light source.

In the case that the abnormality detection method is performed by disposing the light receiving element 13 at a position that blocks off light from the wavelength conversion member 12 as shown in FIG. 1A, then after the abnormality detection method of the light emitting device 10 is completed, the light receiving element 13 moves outside of the light irradiation area, as shown in FIG. 1B. Then, normal lighting is performed by switching the drive of the light emitting device 10 from pulse drive to continuous drive, etc.

Laser Oscillation

In the abnormality detection method, the semiconductor laser element 11 is pulse-driven in order to cause the semiconductor laser element 11 to undergo laser oscillation. That is, the voltage to be applied to the semiconductor laser element 11 is pulse-controlled at a prescribed pulse width to perform pulse drive. Pulse drive is usually controlled by a control circuit of the controller 19.

The prescribed pulse width means a pulse width shorter than the time it takes for the optical intensity of the light extracted from the wavelength conversion member 12 to reach its maximum, when the excitation light emitted from the semiconductor laser element 11 irradiates the wavelength conversion member 12 from the start of voltage application to the semiconductor laser element 11 and its wavelength is converted by the phosphor contained in the wavelength conversion member 12. Also, as will be discussed below, it is assumed that the response speed of the phosphor is related to how long it takes for the optical intensity of the light extracted from the wavelength conversion member 12 to reach its maximum, so from another standpoint, the prescribed pulse width may be one that is shorter than the response time of the phosphor. The "response time of the phosphor" means how long it takes for the phosphor to reach its maximum intensity once the phosphor is irradiated with excitation light.

In particular, it is preferable for the prescribed pulse width to be performed at a pulse width that is equal to or shorter than how long it takes for the optical intensity of the light extracted from the wavelength conversion member to reach half of its maximum value from the start of voltage application to the semiconductor laser element 11. This makes it possible to further reduce the fluorescent component included in the light to be measured. More specifically, an example is when pulse control of the applied voltage is performed at a pulse width of 5 to 50 ns. Setting the pulse width within this short range allows the ratio of fluorescent light in the light emitted from the light emitting device 10 to be reduced, so the intensity of the excitation light can be determined more accurately. It is even better to carry out the detection at a pulse width of 5 to 20 ns. In this Specification, the pulse width in voltage application refers to the time (ON time) from the start of voltage application until the voltage is returned to zero.

The pulse drive of the semiconductor laser element may be such that the element is turned on for only one cycle, that is, one time by voltage application at a prescribed pulse width, but it is preferable to repeat the detection for a plurality of cycles in order to improve detection accuracy. An example is the application of pulse voltage for about 5 to 10 cycles. In this case, the time (OFF time) from when the voltage is returned to zero until the start of the next voltage application may be set to be about the same as the ON time, that is, the pulse width. For example, the OFF time is 10 to 30 ns. More specifically, pulse control can be repeated for alternating cycles of a pulse width of 5 to 20 ns and a pulse width of 10 to 30 ns. Pulse control may be repeated for three or more cycles.

In the pulse control discussed above, it is preferable that the semiconductor laser element 11 to be used is turned on in advance by continuously applying a voltage, the change over time in the optical intensity of the excitation light or the like emitted from the semiconductor laser element from the start of voltage application is measured, and the time it takes for the optical intensity to reach its maximum is confirmed. This makes it possible to find the pulse width that is necessary for the abnormality detection method based on the measured value. Applying a voltage continuously means continuously applying the voltage without letting the voltage drop to zero. The voltage applied to the semiconductor laser element 11 may be raised in stages as way to prevent overshoot.

Furthermore, in the combination of the semiconductor laser element 11 and the wavelength conversion member 12 that are used, it is preferable that the semiconductor laser element 11 is turned on by continuously applying a voltage, and the change over time In the optical intensity of the light extracted from the wavelength conversion member 12 is measured. Alternatively, the optical intensity of just the fluorescent light may be measured by using a bandpass filter that blocks excitation light, for example. This makes it possible to confirm the change over time in the optical intensity of the light extracted from the wavelength conversion member 12 since the start of voltage application to the semiconductor laser element 11. Also, how long it takes from the start of voltage application to the semiconductor laser element 11 until the optical intensity of the light extracted from the wavelength conversion member 12 reaches its maximum can be confirmed.

Obtaining an actual measurement value in this way makes it possible to more accurately specify the pulse width necessary for the abnormality detection method. The actual measurement value may be obtained by using a test-use semiconductor laser element or the like.

Measurement of Optical Intensity of Excitation Light, Etc.

As described above, after the semiconductor laser element 11 is made to generate a laser beam by a specific pulse drive, the optical intensity of the excitation light or the like emitted from the wavelength conversion member 12 is measured.

Figure 2A:
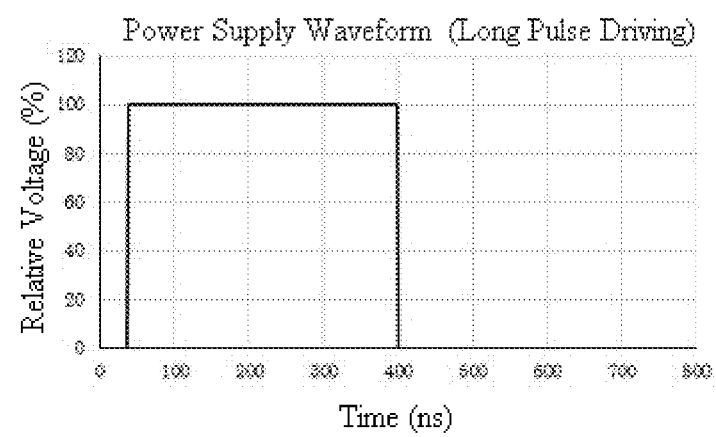
FIG. 2A is a graph showing a power supply waveform in long pulse driving of one embodiment of the light emitting device of the present invention.
Figure 2B:
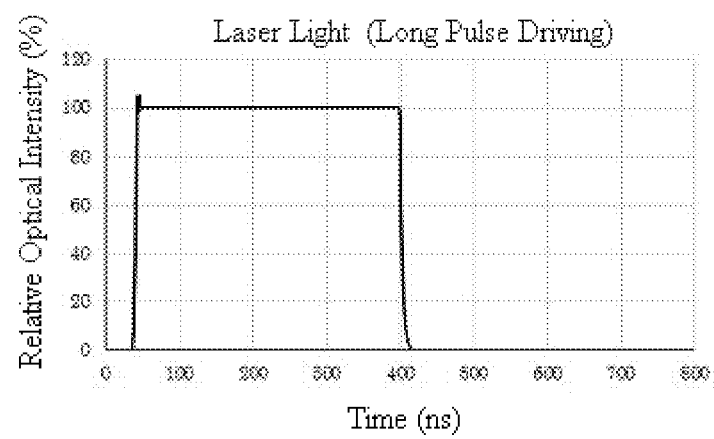
FIG. 2B is a graph showing optical intensity of laser light in long pulse driving of one embodiment of the light emitting device of the present invention.
Figure 2C:
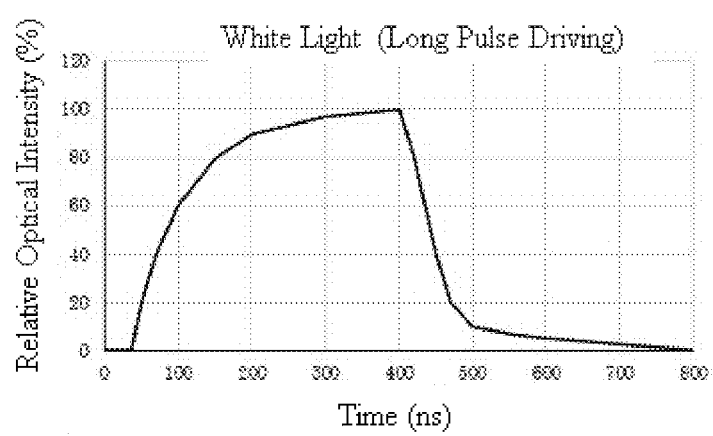
FIG. 2C is a graph showing the optical intensity of white light in long pulse driving of one embodiment of the light emitting device of the present invention.

That is, in general, when a voltage is applied at the pulse width shown in FIG. 2A, the excitation light emitted from the semiconductor laser element is generated slightly later than the start of voltage application as shown in FIG. 2B. The time from the start of voltage application to the semiconductor laser element until the optical intensity of the light emitted by the semiconductor laser element reaches its maximum, that is, the response delay time of the semiconductor laser element is, for example, 5 ns or less. On the other hand, with a light emitting device in which a semiconductor laser element and the wavelength conversion member 12 are combined, for example, as shown in FIG. 2C, the optical intensity of the light extracted from the wavelength conversion member (such as white light) gradually increases, finally reaching its maximum. The time until the optical intensity of the light extracted from the wavelength conversion member reaches its maximum, that is, the response delay time of the light emitting device is, for example, about 300 to 400 ns. The reason why the response delay time of the light emitting device is longer than the response delay time of the semiconductor laser element is believed to be that there is a difference between the response speed of the semiconductor laser element and the response speed of the phosphor, or that it takes some time for all the phosphors contained in the wavelength conversion member to be excited.

Figure 2D:
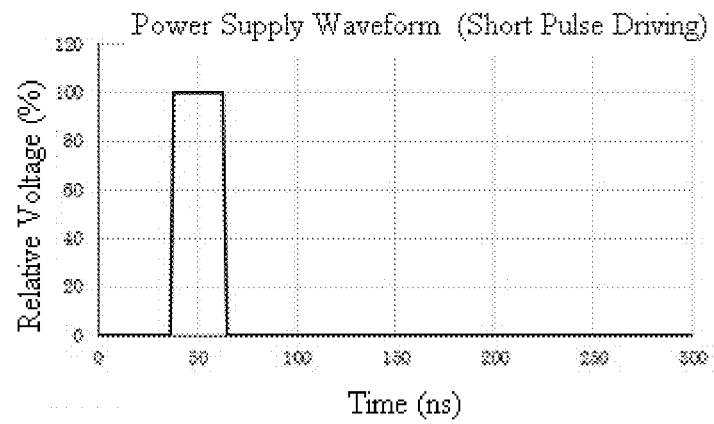
FIG. 2D is a graph showing a power supply waveform in short pulse driving of one embodiment of the light emitting device of the present invention.
Figure 2E:
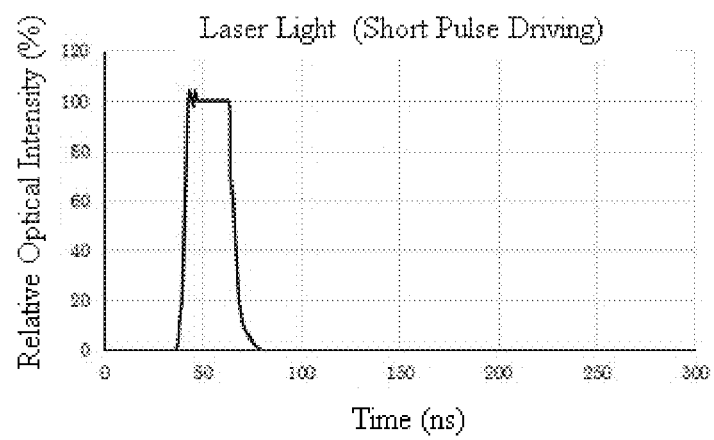
FIG. 2E is a graph showing optical intensity of laser light in short pulse driving of one embodiment of the light emitting device of the present invention.
Figure 2F:
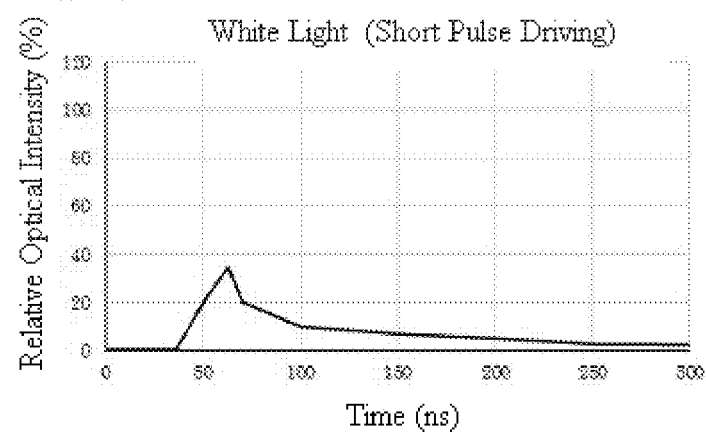
FIG. 2F is a graph showing the optical intensity of white light in short pulse driving of one embodiment of the light emitting device of the present invention.

By utilizing the difference in the timing at which voltage is applied and at which the excitation light and white light are emitted, that is, the difference in response speed between the semiconductor laser element and the wavelength conversion member, it is possible to sense the degree of leakage of excitation light with high accuracy by measuring the optical intensity of the excitation light or the like. FIGS. 2D to 2E show the power supply waveform, the laser light, and the white light, respectively, when voltage is applied at a pulse width shorter than in FIGS. 2A to 2C. As shown in FIGS. 2D to 2E, light within the response delay time of the light emitting device can be easily measured by driving the semiconductor laser element at a sufficiently short pulse width. Since this light has less fluorescent light and a relatively larger amount of excitation light than during complete emission, the intensity of the excitation light can be determined more accurately than in measurement during complete emission.

In order to measure the optical intensity of excitation light or the like as described above, a light receiving element capable of detecting excitation light is used. The light receiving element is disposed at a position where the light from the wavelength conversion member 12 will reach.

The more the light receiving element is disposed at a position where the intensity of the light from the wavelength conversion member 12 is larger, the higher is the detection accuracy. Therefore, as shown in FIG. 1B, it is preferable to dispose the light receiving element 13 directly above the wavelength conversion member 12. However, in the ordinary use of the light emitting device 10, this disposition of the light receiving element 13 can lead to a significant drop in light extracted efficiency. Because of this, the light receiving element 13 is disposed directly above the wavelength conversion member 12 only when measuring the optical intensity of the excitation light or the like, and in the subsequent rated drive of the semiconductor laser element 11, the light receiving element 13 is preferably moved outside the light irradiation region. As a result, it is possible to avoid a decrease in the light extracted efficiency of the light emitting device 10 during rated drive, and to detect light leakage more reliably.

Determination of Optical Intensity

It is determined whether or not the optical intensity of the excitation light or the like measured as described above falls within a prescribed range. The "within a prescribed range" here can be determined on the basis of the value obtained by using a properly functioning light emitting device 10 in which no light leakage occurs to pulse-drive the semiconductor laser element 11 by the same method, and measuring the optical intensity of the excitation light, etc., extracted from the wavelength conversion member 12. In the case that the measured value is higher than the prescribed range determined in this way, it can be concluded that some kind of defect has occurred in the wavelength conversion member 12, and the excitation light is leaking. For example, an optical intensity of 110% or more of the optical intensity of a properly functioning light emitting device 10 can be considered an abnormal value where light leakage occurs. The main thing is that the optical intensity of the light emitted by the light emitting device 10 stays within the range considered to be safe, so it is also possible to use an optical intensity of 120% or more, or an optical intensity of 130% or more, of the optical intensity of a properly functioning emitting device 10 as an abnormal value. Also, from another standpoint, with a light emitting device in which light leakage is occurring, the optical intensity immediately after voltage is applied to the semiconductor laser element tends to be higher than it is afterward, so it may be determined that a light emitting device is not functioning properly when the initial value of the optical intensity measured at one voltage application is higher than it is afterward.

Figure 4:
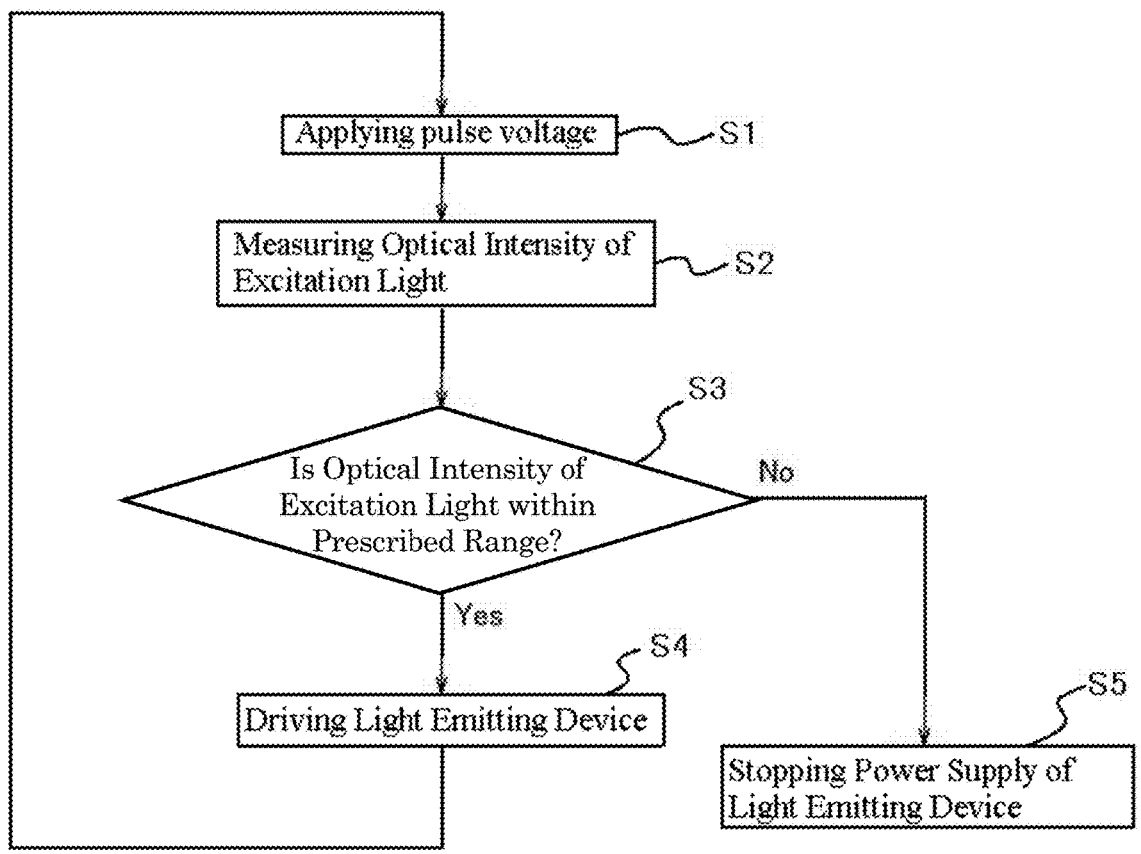
FIG. 4 is a flowchart for explaining the operation of one embodiment of the light emitting device of the present invention.

That is, as shown in FIGS. 3 and 4, in step S1, the user performs a specific operation to output a drive signal from the controller to the power supply, and a pulse voltage is applied to the semiconductor laser element by the power supply. As a result, the semiconductor laser element is pulse-driven.

The excitation light generated from the semiconductor laser element 11 irradiates the wavelength conversion member 12 and is converted into fluorescent light having a longer wavelength by the phosphor contained in the wavelength conversion member 12. Also, the rest of the excitation light generated from the semiconductor laser element 11 is extracted to the outside of the wavelength conversion member 12 without undergoing wavelength conversion by the phosphor. Consequently, the light emitted by the light emitting device 10 and extracted from the wavelength conversion member 12 is extracted as white light, for example, by mixing fluorescent light and excitation light.

In step S2, the optical intensity of the excitation light or the like is measured by the light receiving element 13. Then, in step S3, it is determined whether or not the measured optical intensity falls within a prescribed range. In the case that it is within the prescribed range, the flow proceeds to step S4, and the semiconductor laser element is driven normally. After this, the flow returns to step S1, and steps S2 and S3 may be repeated.

On the other hand, in the case that the wavelength conversion member 12 is defective for some reason, the laser light generated from the semiconductor laser element 11 is not converted into fluorescent light by the phosphor even when it irradiates the wavelength conversion member 12, and a larger proportion is emitted to the outside while still in the form of excitation light. In this case, since the optical intensity of the measured excitation light or the like is not within the prescribed range, in the case that it is determined that the optical intensity is not within the prescribed range, the flow proceeds to step S5, and the application of voltage to the semiconductor laser element 11 is stopped. Alternatively, normal drive of the semiconductor laser element 11 is not permitted.

This method makes it possible to accurately detect abnormality in a light emitting device 10 in which a defect such as cracking or coming loose has occurred in the wavelength conversion member 12. As a result, the drive of the semiconductor laser element 11 can be stopped.

The length of time from the start of voltage application to the semiconductor laser element 11 until the end of the determination as to whether or not the measured optical intensity falls within a prescribed range is preferably 5 milliseconds (ms) or less. Thus keeping the execution time of the abnormality detection method to a length of time that is too short to be perceived by the human eye means that the detection is not recognized as a flicker or the like by the human eye, so it may be performed during normal lighting.

Experimental Example

Changes in the optical intensity of excitation light or the like were measured using the light emitting device 10 having a properly functioning wavelength conversion member 12 shown in FIG. 1A, and the light emitting devices A to J having various kinds of defects in the wavelength conversion member. Here, a blue laser element which generates blue laser light with an oscillation wavelength (peak wavelength) of about 450 nm was used as the semiconductor laser element 11. The measurement conditions included a bias current of 200 mA and an amplitude of 10 V. The rise time (response delay time) of the semiconductor laser element 11 was about 2 ns.

A ceramic containing a YAG phosphor was used as the wavelength conversion member 12. In this experimental example, instead of installing the light receiving element 13, measurement was performed using an optical oscilloscope having a radiation sensitivity of 1 mA/W or more over the entire wavelength range of 400 to 700 nm.

The rise time (response delay time) of the light emitting device 10 including a properly functioning wavelength conversion member 12 was about 350 ns.

In these light emitting devices 10, the pulse width was set to 10 ns as a pulse width shorter than the length of time from the start of voltage application to the semiconductor laser element 11 until the optical intensity of the light extracted from the wavelength conversion member 12 or the like reached its maximum, the OFF time was set to 20 ns, and voltage was applied to the semiconductor laser element 11 by pulse control in five cycles.

Consequently, the semiconductor laser element 11 was laser oscillated and the optical intensity was measured with a photodiode.

Figure 5A:
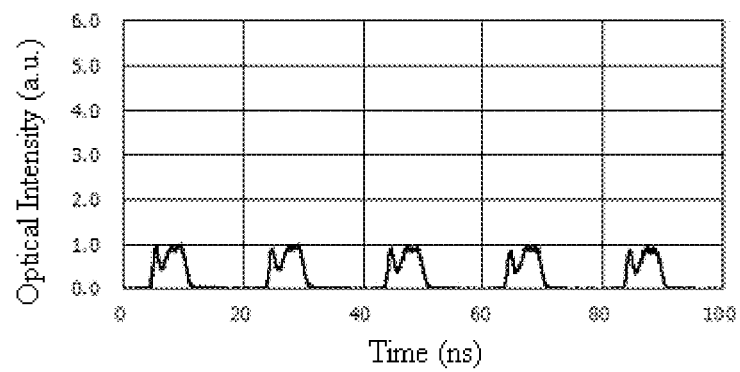
FIG. 5A is a graph showing the optical intensity of excitation light in pulse driving of the light emitting device including the normal wavelength conversion member according to one embodiment of the present invention.
Figure 6:
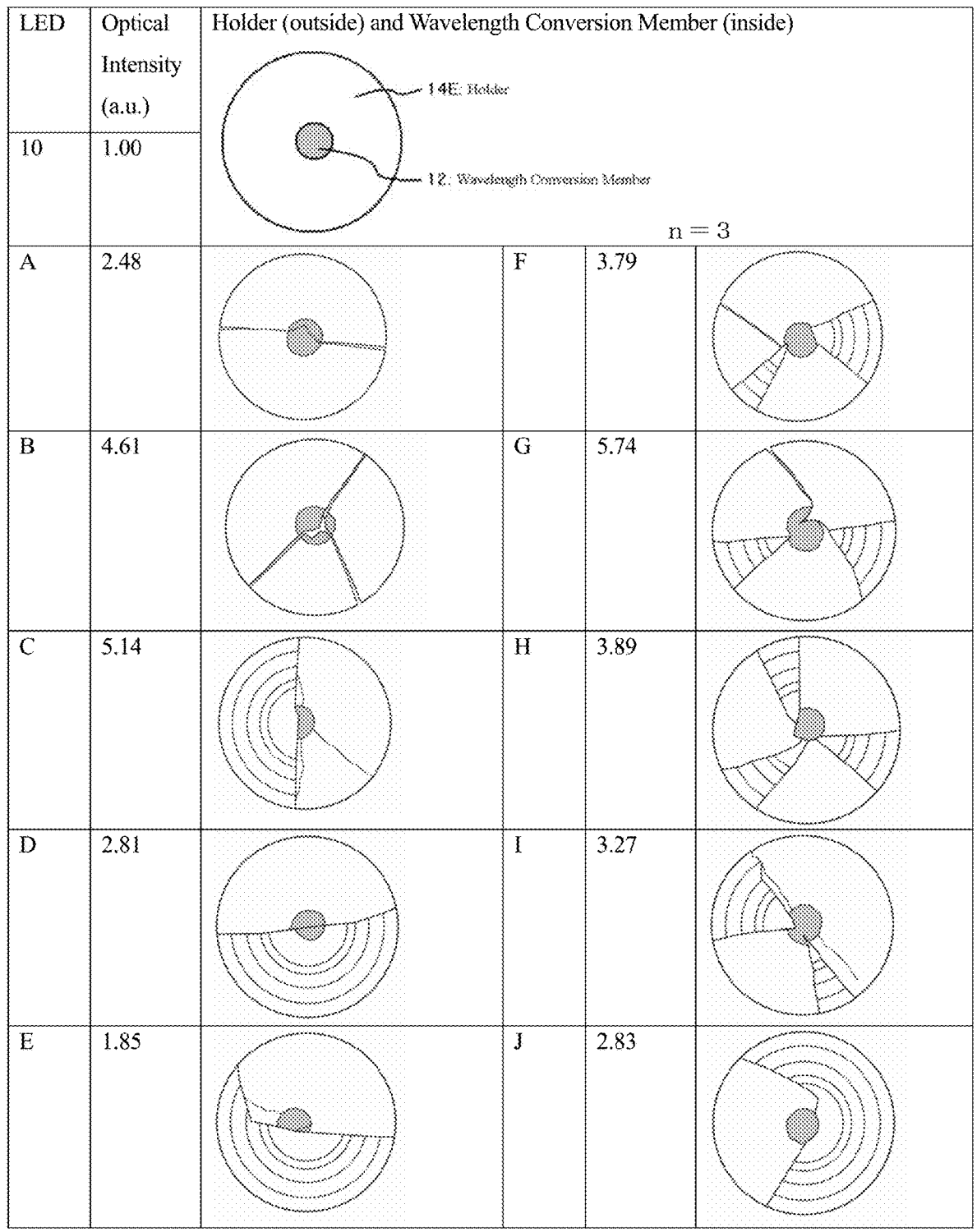
FIG. 6 is a table showing the experimental examples of the values of changes in the optical intensity of excitation light measured using the light emitting device 10 having a properly functioning wavelength conversion member 12 shown in FIG. 1A and the light emitting devices A to J having various kinds of defects in the wavelength conversion member.

The results are shown in the table of FIG. 6. In this table, defects in the holder 14E and the wavelength conversion member 12 fixed to the upper support member 14D are shown by simplified diagrams as seen from the light extracted face side of the wavelength conversion member 12 of the light emitting device 10 in FIG. 1A. In the light emitting devices C to J, part of the lower support member 14C disposed underneath is exposed due to defects in the holder 14E, and the lower support member 14C in each of the simplified views is shown along with bumpiness on the surface thereof. Also, in FIG. 6, "optical intensity" indicates the relative maximum value of the optical intensity when we let 1.0 be the maximum value of the optical intensity of the light emitting device 10, as shown in FIG. 5A (discussed below).

From these results, a product was determined to be either properly functioning or abnormal depending on the measured optical intensity, and whether or not the light emitting device was properly detecting abnormality was confirmed. First, a plurality of the light emitting devices 10 listed in the above table and their equivalent products were measured. The average of the maximum values of the optical intensity of the properly functioning products was about 0.91, the standard deviation ($\sigma$) was about 0.08, and the value obtained by adding a value ($5\sigma$) five times the standard deviation to the average value was about 1.32. Although there was a difference in degree, all of the light emitting devices A to J having some kind of defect in the wavelength conversion member exhibited an optical intensity of 1.32 or more, so it was concluded that the difference between the optical intensity of a properly functioning product and the optical intensity of an abnormal product was large enough not to cause a detection error. Therefore, for the maximum value of the optical intensity, for example, less than 1.32 can be used as the prescribed range, that is, the normal range, and anything above that can be considered to be abnormal.

Figure 5B:
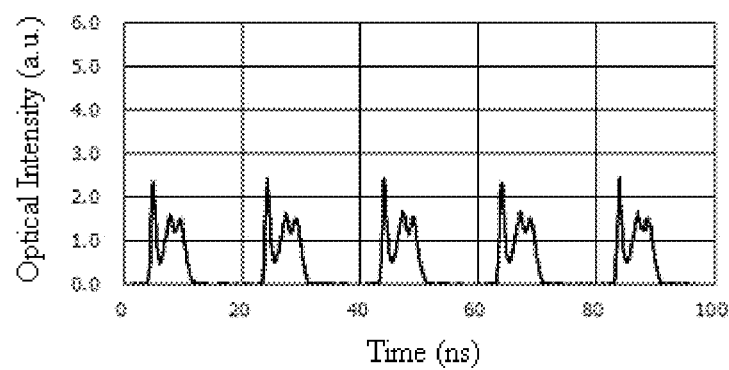
FIG. 5B is a graph showing optical intensity of excitation light in pulse driving of the light emitting device having a defective wavelength conversion member.
Figure 5C:
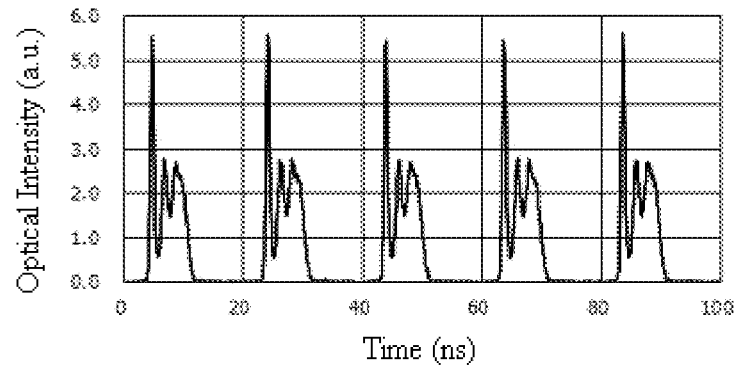
FIG. 5C is a graph showing optical intensity of excitation light in pulse driving of the light emitting device having another defective a wavelength conversion member.

Of the light emitting devices shown in FIG. 6, the light emitting device 10 equipped with a properly functioning wavelength conversion member and light emitting devices A and G exhibited the changes over time in measured optical intensity as shown in FIGS. 5A to 5C, respectively. In FIGS. 5A to 5C, the horizontal axis is elapsed time and the unit is nanoseconds. The vertical axis is optical intensity, the unit is an arbitrary unit, and the numerical values that are the same in FIGS. 5A to 5C indicate the same intensity.

As shown in FIG. 5A, with the light emitting device 10 having a properly functioning wavelength conversion member, the optical Intensity (for example, 0.8) of excitation light or the like measured at the initial voltage application (for example, within 5 ns) is substantially the same as the optical intensity of excitation light or the like measured later, whereas with the light emitting devices A and G with defective wavelength conversion members as in FIGS. 5B and 5C, the optical intensity of the excitation light or the like measured at the initial voltage application was higher than that of the light emitting device 10 (1.7 and 4.1, respectively). Also, in these light emitting devices A and G, the optical intensity of the excitation light or the like measured later than the initial pulse control was measured to be a considerably lower value than the initial optical intensity (1.2 and 1.8, respectively).

Thus, with the method for detecting abnormality in a light emitting device in this embodiment, an abnormality consisting of a defect in the wavelength conversion member can be very accurately detected by a light receiving element capable of detecting excitation light. As a result the emission of the light emitting device can be stopped, such as by stopping the drive of the semiconductor laser element.

The light emitting device of an embodiment of the present invention can be suitably used as a light source for various display devices, lighting devices, liquid crystal displays, projector devices, endoscopes, vehicle headlights, and the like.

What is claimed is:

1. A method for detecting abnormality in a light emitting device including a semiconductor laser element configured and arranged to be pulse-driven by pulse-control to emit excitation light, and a wavelength conversion member including a phosphor and configured and arranged to emit fluorescent light by being irradiated with the excitation light, the method comprising:
   pulse-controlling an applied voltage applied to the semiconductor laser element with a pulse width shorter than a time from a start of voltage application until an optical intensity of light extracted from the wavelength conversion member reaches a maximum intensity, thereby pulse-driving the semiconductor laser element to achieve laser oscillation;
   measuring an optical intensity of the excitation light, or optical intensities of both the excitation light and the fluorescent light; and
   determining whether or not the optical intensity or the optical intensities falls within a prescribed range.

2. The method for detecting abnormality in a light emitting device according to claim 1, wherein
   the pulse-controlling of the applied voltage includes pulse-controlling the applied voltage with a pulse width that is equal to or shorter than a time from the start of voltage application until the optical intensity of the light extracted from the wavelength conversion member reaches half of the maximum intensity.

3. The method for detecting abnormality in a light emitting device according to claim 1, wherein
   the pulse-controlling of the applied voltage includes pulse-controlling the applied voltage with an ON time of 5 to 50 ns.

4. The method for detecting abnormality in a light emitting device according to claim 1, wherein
   the pulse-controlling of the applied voltage includes pulse-controlling the applied voltage with two or more cycles with each cycle consisting of an ON time of 5 to 20 ns and an OFF time of 10 to 30 ns.

5. The method for detecting abnormality in a light emitting device according to claim 1, further comprising:
   before the measuring the optical intensity of the excitation light or the optical intensities of both the excitation light and the fluorescent light,
   measuring the time from the start of voltage application until the optical intensity of the light extracted from the wavelength conversion member reaches the maximum intensity, and
   setting a pulse width for the pulse-driving based on the time measured.

6. The method for detecting abnormality in a light emitting device according to claim 1, wherein
   the measuring of the optical intensity of the excitation light is performed by the light receiving element disposed outside of a package of the light emitting device which houses the semiconductor laser element and supports the wavelength conversion member.

7. The method for detecting abnormality in a light emitting device according to claim 1, wherein
   the light receiving element is disposed movably from a light irradiation region of the light emitting device to a region outside the light irradiation region.

8. The method for detecting abnormality in a light emitting device according to claim 7, further comprising
   moving the light receiving element outside the light irradiation region after the optical intensity of the excitation light or the optical intensities of both the excitation light and the fluorescent light has been measured.

9. The method for detecting abnormality in a light emitting device according to claim 1, wherein
   a length of the time from the start of voltage application until an end of the determining of whether or not the optical intensity or the optical intensities falls within the prescribed range is 5 milliseconds or less.

10. A light emitting device comprising:
    a semiconductor laser element configured and arranged to be pulse-driven by pulse-control to emit excitation light;
    a wavelength conversion member including a phosphor and configured and arranged to emit fluorescent light by being irradiated with the excitation light; and
    a light receiving element disposed on a light extraction side of the wavelength conversion member, and configured and arranged to detect light having a wavelength corresponding to the excitation light, the light receiving element being disposed movably from a light irradiation region to a region outside the light irradiation region.

11. The light emitting device according to claim 10, further comprising
    a package housing the semiconductor laser element and supports the wavelength conversion member, wherein
    the light receiving element is disposed outside of the package.

12. The light emitting device according to claim 10, wherein
    the wavelength conversion member has a light incident face on which light from the semiconductor laser element is incident, and a light extraction face that is a different from the light incident face.

* * * * *